United States Patent [19]

Shiraishi

[11] Patent Number: 5,681,758

[45] Date of Patent: Oct. 28, 1997

[54] METHOD FOR FABRICATING SEMICONDUCTOR SINGLE CRYSTAL

[75] Inventor: Yutaka Shiraishi, Hiratsuka, Japan

[73] Assignee: Komatsu Electronic Metals Co., Ltd., Hiratsuka, Japan

[21] Appl. No.: 743,046

[22] Filed: Nov. 4, 1996

[51] Int. Cl.$^6$ ................................................. H01L 21/00
[52] U.S. Cl. ........................... 437/7; 437/8; 117/38; 117/39
[58] Field of Search ........................... 437/7, 8; 117/38, 117/39

[56] References Cited

U.S. PATENT DOCUMENTS

| | | | |
|---|---|---|---|
| 4,708,764 | 11/1987 | Boden et al. | 117/39 |
| 5,248,377 | 9/1993 | Ting | 117/39 |
| 5,597,737 | 1/1997 | Greer et al. | 437/8 |

Primary Examiner—Charles L. Bowers, Jr.
Assistant Examiner—Ramamohan Rao Paladugu
Attorney, Agent, or Firm—Varndell Legal Group

[57] ABSTRACT

A method of supplying raw material for fabricating semiconductor single crystal according to the continuously charged method provides an inventive method to overcome the problems of the raw material being charged either insufficiently or excessively, and to charge the raw material steadily. According to the inventive method, the raw material of two polysilicon bars is melted simultaneously and flows to the crucible. By calculating the difference between the weight of the growing single crystal and that of the molten raw material, the insufficiency or excess of the raw material charged is obtained, thereby inducing the equivalent regulation. Further, the coordinates of the tips of the raw material of two polysilicon bars while molten is taken to control the power of the two heaters which melt the polysilicon bars respectively for keeping the coordinates of the two tips in a constant position. The supply rates and the coordinates of the two polysilicon bars are under control, so adequate raw material is charged to grow the single crystal.

3 Claims, 4 Drawing Sheets

METHOD FOR FABRICATING SEMICONDUCTOR SINGLE CRYSTAL

BACKGROUND OF THE INVENTION

1. Field of the Invention

The present invention relates to a method of supplying raw material for fabricating semiconductor single crystal in accordance with the continuously charged method.

2. Description of Related Art

Most of the substrates used for making semiconductor devices are made of single crystal silicon. One of the methods for fabricating single crystal silicon is the Czochralski method (hereinafter called the CZ method). According to the CZ method, the raw material of polysilicon is charged into a crucible which is disposed in the chamber of the apparatus for making single crystal silicon. Utilizing the heaters surrounding the crucible, the raw material of polysilicon is heated until molten. Then, the seed crystal disposed on the seed chuck is immersed in the molten polysilicon solution (hereinafter called melt). Both the crucible and the seed chuck rotate in either the same or counter direction mutually and the seed chuck is drawn up simultaneously, whereby the single crystal silicon is formed.

Recently, as the diameters of semiconductor wafers have grown large to over six inches, making single crystal silicon of a diameter greater than six inches has become the major tendency for the fabrication of single crystal silicon. According to the CZ method, an efficient method for fabricating large-diameter wafers is to supply an equal amount of polysilicon raw material into the crucible by checking the amount of the single crystal silicon drawn up, i.e., utilizing the continuously charged method along with drawing single crystal silicon continuously. FIG. 4 illustrates, in cross section, an example of an apparatus for fabricating single crystal silicon, which involves melting the polysilicon bar according to the continuously charged CZ method. In FIG. 4, the semiconductor single crystal silicon 4 is formed and drawn out from the center of the crucible 3 and there are two heaters 1 for melting the polysilicon bars, which are disposed above the crucible 3. The raw material of polysilicon bars 2 suspended in the upper chamber 5 of the apparatus are put in the heater 1 alternatively and the polysilicon bars 2 are melted. The molten polysilicon drops into the crucible in which the melt 6 is filled. When the polysilicon bar at one side is exhausted, the polysilicon bar 2 at the other side is immediately melted such that keeping the raw material charged continuously. Two shielding buckets 7, with their under sides soaked in the melt 6, enclose the heaters 1 respectively, thereby preventing the resonant transmission resulting from the molten polysilicon dropping the melt 6 and the vapor separation. In FIG. 4, numeral 8 is the primary heater, numeral 9 is a bucket for temperature-keeping, and numeral 10 is the axis of the crucible.

In the continuously charged CZ method, the drops are formed by melting the polysilicon bars, and flow into the crucible. The supply rate of polysilicon bars and the power of the heaters for melting polysilicon bars are kept constant, whereby the operation of the continuously charged CZ method is performed. However, degeneration of the heaters for melting polysilicon bars and the dispersion of the diameters of the polysilicon bars result in insufficient or excessive charge of polysilicon bars. Further, when the fluctuation of the radiating heat from the primary heater results in excessive melting of polysilicon bars, the distance between the surface of the melt and the tip of the polysilicon bar becomes greater such that the drops trickling into the melt splash with greater force. Furthermore, when the melting rate is not fast enough, the tip of the polysilicon bar comes in contact with the melting heater 1.

SUMMARY OF THE INVENTION

Accordingly, it is an object of the present invention to provide a method for keeping the tip of the polysilicon bar at the same position and supplying the polysilicon raw material steadily, in accordance with the continuously charged method, thus overcoming the problems described above in the related art. In order to attain the above objects, the inventive method according to the continuously charged method for fabricating the semiconductor single crystal involves disposing two heaters for melting polysilicon bars above the crucible which holds the molten silicon. The heaters melt the polysilicon bars such that the molten drops trickle into the crucible. Then, while the semiconductor single crystal is being drawn out, the two polysilicon bars are melted. The difference between the weight of the growing single crystal and the weight of the molten raw material of polysilicon bars is used to calculate the equivalent modification to compensate for an insufficiency or excess of polysilicon bar raw material, which serves as a reference to control the supply rate of polysilicon bars, and calculate the coordinates of the tips of the molten polysilicon bars. This serves to keep the tips of the polysilicon bars at their initial positions as melting starts, by controlling the power of the heaters.

For example, if the diameter of the growing single crystal is D, the growing rate is $V_c$, the diameters of the two polysilicon bars are $d_1$ and $d_2$ respectively, then the reference rate $V_0$ for supplying the polysilicon bars is obtained by the following formula:

$$V_0 = D^2 \times V_c / (d_1^2 + d_2^2).$$

From the beginning to time t, the additional weight of the semiconductor single crystal is $W_c$ and the total weight of the raw material supplied is $W_n$. The regulating parameter $\alpha$ of the supply rate of the polysilicon bar is adjusted to compensate for either an insufficiency or excess of polysilicon raw material, thus the supply rate V of the polysilicon bars is determined by the following formula:

$$V = V_c + \alpha(W_c - W_n)$$

so as to compensate for an insufficiency or excess of polysilicon raw material.

The two polysilicon bars 2 are charged to the heaters 1 at the rate of V. When the melting process starts initially, at this time, the upper end of the polysilicon bar serves as the reference point and its coordinates is $T_0$, and the weight of the polysilicon bar is $W_0$. At a time t, the reference coordinates is $T_t$, the weight and density of the polysilicon bar are $W_t$ and $\rho$ respectively, and the diameter of the polysilicon bar 2 is d, and the position fluctuation p of the tip at a time t is determined as follows:

$$p = T_t - T_0 - (W_0 - W_t)/(\pi d^2/4) \times \rho;$$

such that the power of the heater is controlled by setting the fluctuation p to zero.

As described above, by controlling the supply rate of the raw material of the polysilicon bars and the power supplied to the heaters, the melting rates of the raw material of polysilicon bars are kept constant, so the weight of the raw material charged to the melt is equivalent to the weight of the growing single crystal. Further, the tips of the polysilicon bars always remain at the initial position where the melting process starts, therefore, the large splash due to drops falling into the melt is moderated and the tips of the raw material do not come in contact with the heaters. Further, even if the two polysilicon bars are melted alternatively, the two heaters operate continuously such that the temperature distribution within the chamber of the apparatus is uniform. According to the present invention the two polysilicon bars are designated to be heated simultaneously, consequently, the thermal energy of the heaters is utilized sufficiently.

DETAILED DESCRIPTION OF THE INVENTION

Figure 1:
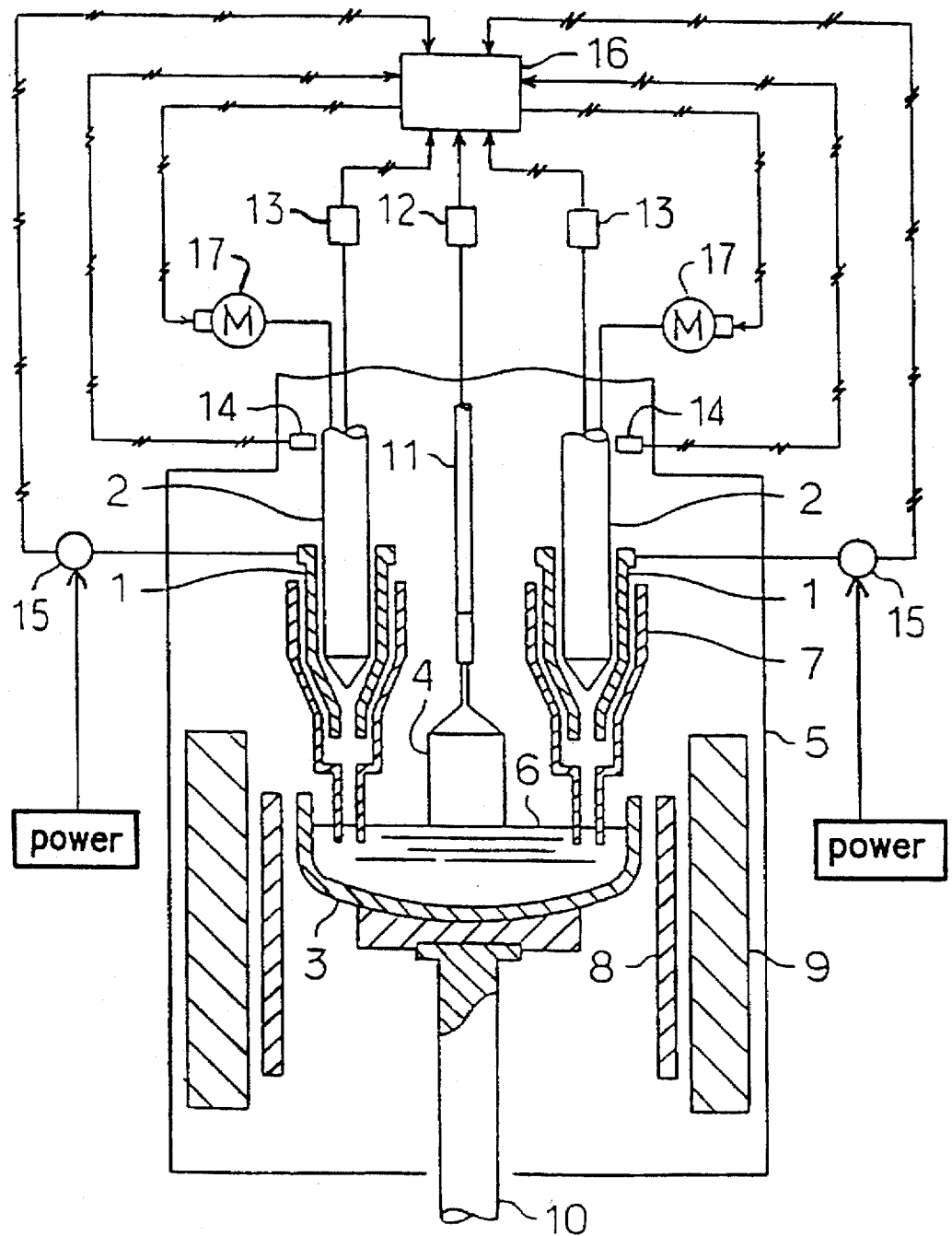
FIG. 1 illustrates, in cross section, a portion of the apparatus for fabricating the single crystal in accordance with the continuously charged method.

The inventive method for fabricating semiconductor single crystal silicon according to the continuously charged method is described hereinafter. Wherever possible, the same reference numerals will be used throughout the drawings to refer to the same or corresponding parts.

FIG. 1 illustrates, in cross section, a portion of the apparatus for fabricating the single crystal silicon. In FIG. 1, a load cell 12 for sensing the weight of the single crystal 4 is disposed above the lift shaft(or the lift metal line) 11, and the other two load cells 13 for sensing the weight of the raw material of two polysilicon bars 2 respectively are disposed above their corresponding polysilicon bars 2. There are two position sensors 14 for sensing the fluctuation of the reference position of the polysilicon bars 2 which are disposed near the polysilicon bars 2. The current sensors 15 perceive the currents flowing into the raw material heaters 1. The load cells, 12 and 13, and sensors, 14 and 15, all output signals to the controller 16, which controls the motor 17 to put down the two polysilicon bars 2 at the same rate by outputting an instruction signal to the motor 17. The power supplied to heater 1 is also controlled by an instruction signal from the controller 16, not shown in FIG. 1.

The present invention allows the two polysilicon bars to melt simultaneously, and charges the polysilicon raw material with the equivalent weight of growing single crystal to the crucible 1, consequently, the molten rate of the polysilicon bars 2 is controlled by controlling the supply rate of the raw material of polysilicon bars and the power supplied to the heaters 1. Therefore, the melting processes of the two polysilicon bars are independent of the difference between their diameters, and the two polysilicon bars start and finish their melting processes simultaneously.

At this time, the diameter of the growing single crystal is D, the growing rate is $V_c$, the diameters of the two polysilicon bars are $d_1$ and $d_2$ respectively, and the reference rate $V_0$ for supplying the polysilicon bars is obtained by the following formula:

$$V_0 = D^2 \times V_c / (d_1^2 + d_2^2).$$

At a time t, the weight of the semiconductor single crystal silicon is $W_c$ and the total weight of the raw material is $W_n$. The regulating parameter $\alpha$ of the supply rate of the polysilicon bar is adjusted to compensate for either an insufficiency or excess of the polysilicon raw material, and thus the supply rate V of the polysilicon bars is determined by the following formula:

$$V = V_0 + \alpha(W_c - W_n).$$

The two polysilicon bars 2 are charged to the heaters 1 at the rate of V.

Figure 2:
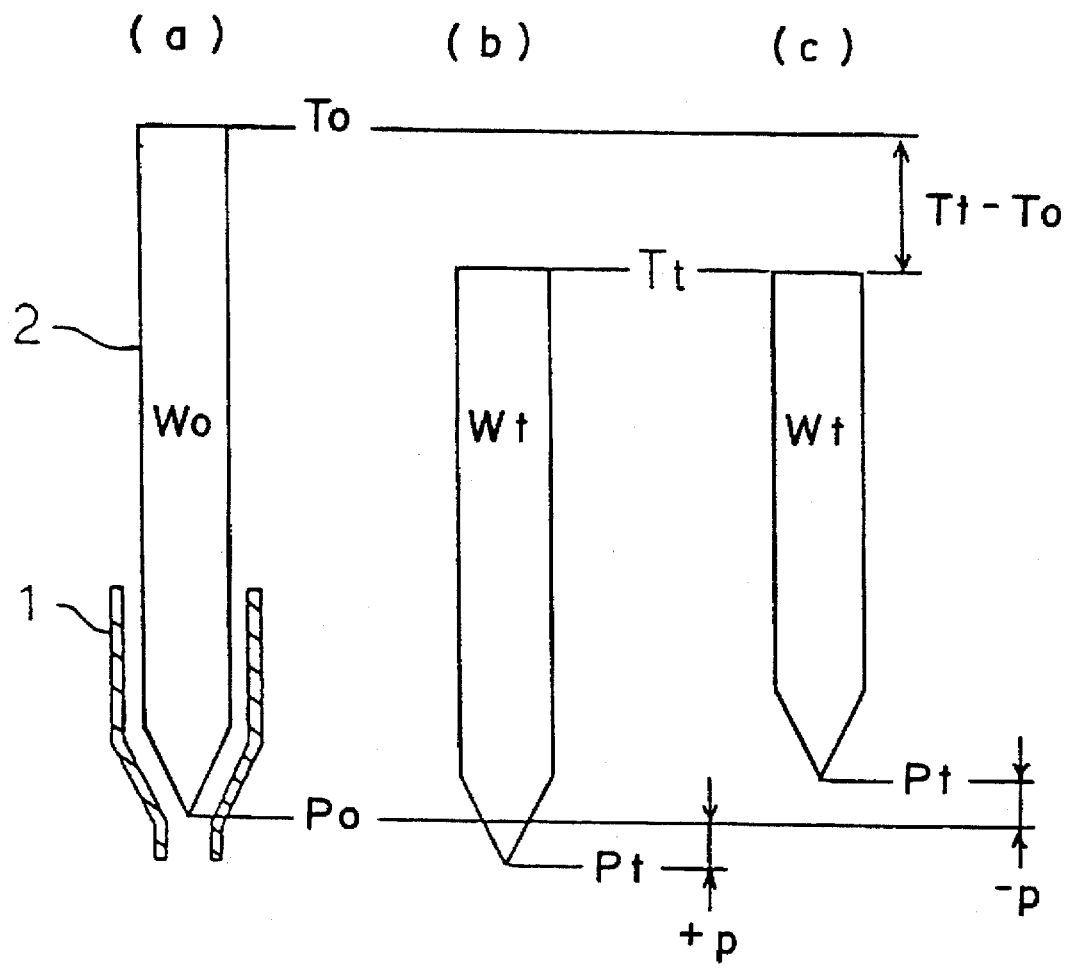
FIG. 2 illustrates the fluctuating positions of the tip of the polysilicon bar while molten, wherein (a) shows the starting of initial molten process, (b) shows the state of insufficient melting, and (c) shows the state of excessive melting.

FIG. 2 illustrates the fluctuating positions of the polysilicon bar tips. In FIG. 2(a), shows the state when the melting process starts. At this time, the upper end of the polysilicon bar serves as the reference point and their coordinates are represented by $T_0$, and the coordinates of the tip of the polysilicon bar, by $P_0$, and the weight of the polysilicon bar is $W_0$. When the melting process of the polysilicon bars starts, the coordinates of the tip of the polysilicon bars 2 are the same as $P_0$. In FIG. 2(b) illustrates that the polysilicon bar is insufficiently melted at a time t, and in FIG. 2(c) illustrates that the polysilicon bar is excessively melted at a time t.

In FIGS. 2(b) and 2(c), the reference coordinates are represented by $T_t$, the coordinates of the tip, by $P_t$, the weight and density of the polysilicon bar are $W_t$ and $\rho$ respectively, and the diameter of the polysilicon bar 2 is d, and the position fluctuation p of the tip at a time t is attained as follows:

$$p = T_t - T_0 - (W_0 - W_t)/(\pi d^2 / 4) \times \rho;$$

where, $T_t - T_0$ showing the fluctuation of the reference point of the polysilicon bar 2, and $(W_0 - W_t)/(\pi d^2/4) \times \rho$ showing the length that the polysilicon bar 2 is melted. In FIGS. 2(b) and 2(c), the position fluctuations of the tips are shown as +p and −p respectively. Thus, the coordinates of the tip is $P_t = P_0 \pm p$. The position fluctuation p of the tip is attained according to the difference between the fluctuation of the polysilicon bar 2 reference point ($T_t - T_0$) and the actual length of the polysilicon bar 2 melted. Controlling the power of the heater 1 makes the tip fluctuation p equal to zero such that the tip of the polysilicon bar 2 is kept at a constant position. For the two polysilicon bars, the fluctuations of their tips are calculated respectively, whereby the power of the heaters is controlled according to the tip fluctuations.

Figure 3:
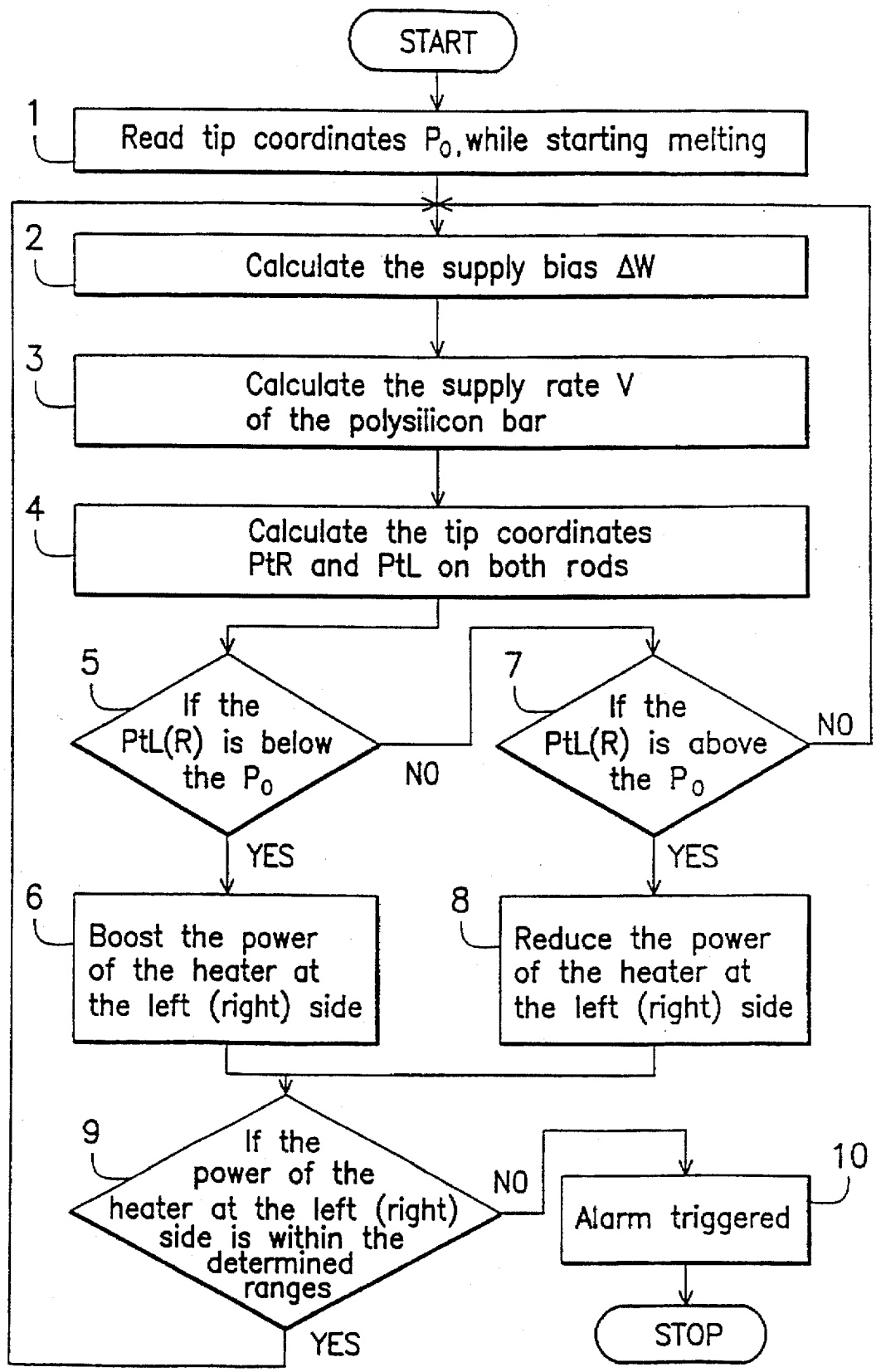
FIG. 3 illustrates the flow chart of the process to keep the position of the tip of the polysilicon bar at a constant position.
Figure 4:
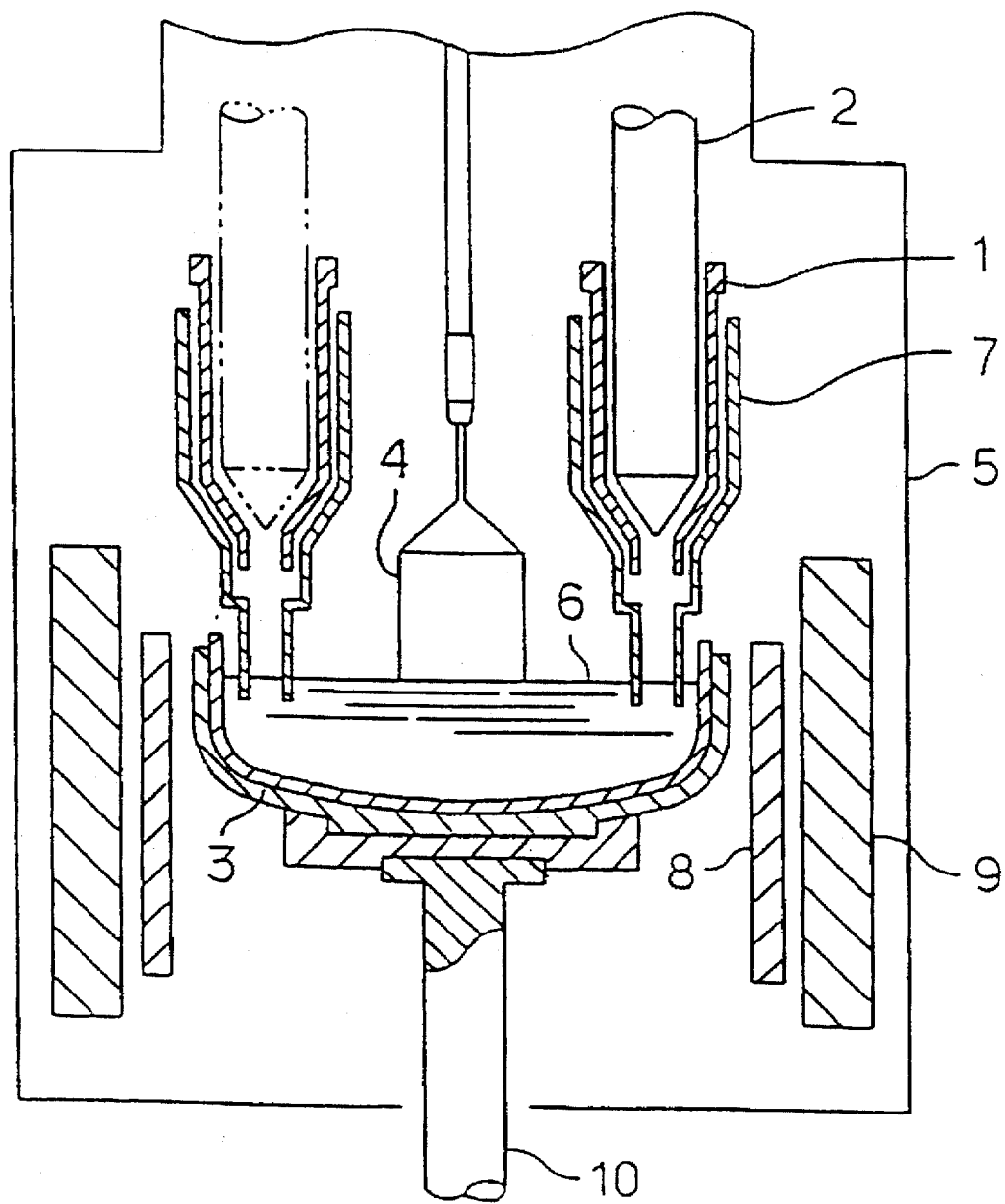
FIG. 4 illustrates, in cross section, a portion of the apparatus for fabricating the semiconductor single crystal silicon according to the conventional art.

FIG. 3 illustrates the flow chart of the preferred embodiment for keeping the tip positions of the polysilicon bars constant. The power of the heaters are controlled as follows. In FIG. 3, the numeral beside each step indicates the step number. The power control of the heaters is achieved based on the following steps. First, after the melting process has started, the tip coordinates $P_0$ of the two polysilicon bars (right and left side) are read in step 1, and the supply bias $\Delta W$ of the raw material of polysilicon is calculated according to the formula:

$$\Delta W = W_c - W_n,$$

in step 2.

In step 3, the supply rate V of the polysilicon bars is calculated according to the formula:

$$V = D^2 \times V_c / (d_1^2 + d_2^2) + \Delta W \times \alpha,$$

and in step 4, the tip coordinates PtR of the polysilicon bar on the right Side and the tip coordinates PtL of the polysilicon bar on the left side are calculated at a time t.

Next in step 5, a check is performed to determine if the PtL (PtR) is below the initial position $P_0$. If PtL (PtR) is below $P_0$, it means that the rate of melting is slower than the supply rate of the raw material of polysilicon, so the power of the heater at left side (right side) is boosted accordingly in step 6. On the other hand, if PtL (PtR) is above $P_0$ and, then, the procedure proceeds to step 7. In step 7, a check is performed to determined if the PtL (PtR) is above the initial position $P_0$. If PtL (PtR) is above $P_0$, it means that the rate of melting is faster than the supply rate of the polysilicon bar, so the power of the heater at left side (right side) is reduced accordingly in step 8. In step 7, if PtL (PtR) is not above $P_0$, then the procedure proceeds to step 2.

In addition, in step 9 a check is performed to determined whether the power of the heaters regulated according to the step 6 or 8 is within the determined power ranges, if it is within these ranges, the procedure proceeds to step 2. If it exceeds the ranges, the procedure proceeds to step 10, the alarm is triggered, and the operation is terminated. The controlling procedure described as above is carried out for the right side and left side polysilicon bars respectively.

By using the controlling procedure described above, the raw material of polysilicon bars are charged steadily, and there is no insufficiency or excess of polysilicon raw material. Meanwhile, the tip of the polysilicon bar remains at a constant position, so the splash of the drops is reduced, and thereby preventing contact between the polysilicon bars and the heaters. Furthermore, the two polysilicon bars are melted at the same time and the initial and final time of the melting process is the same for the two polysilicon bars on both sides, so that even if the diameters of the polysilicon bars on both sides are different, the total amount of the supply of polysilicon raw material does not fluctuate.

The present invention in accordance with the above description, involves controlling the supply rate of the polysilicon bar and the power supplied to the heater, the melting rate of the polysilicon raw material corresponds to the growth rate of the single crystal silicon, so the raw material melts, flows steadily into the melt, and provides the equivalent amount of the growing single crystal silicon. Furthermore, even though the diameters of the polysilicon bars on both sides are different, the melting rates of the two polysilicon bars remain uniform. The tip of the polysilicon bar is kept at a constant position by controlling the power of the heater such that the large splash caused due to the drops is reduced, and the polysilicon bars are prevented from contacting with the heater. Consequently, the continuously charged method according to the present invention promotes single crystal quality and productivity.

What is claimed is:

1. A method of supplying raw material for fabricating semiconductor single crystal according to a continuously charged method, utilizing two heaters for melting raw material bars which are disposed above a crucible containing melt of said raw material; then drawing up and forming single crystal simultaneously while said molten raw material flows to said crucible and, thereby fabricating said single crystal; wherein said method is characterized by:

melting two said raw material bars simultaneously, determining the difference between the weight of said growing single crystal and said molten raw material to calculate the corresponding modification necessary for compensating the mismatch of charged raw material, using said modification and the reference supply rate of said raw material bars to adjust said reference supply rate of said two raw material bars, and simultaneously calculating the coordinates of the tips of said two raw material bars and keeping said tips at constant positions while said raw material bars start to melt initially by controlling the power of said two heaters based on said coordinates of said tips.

2. The method of claim 1, wherein said reference supply rate of the two raw material bars is defined as follows:

$$V_0 = D^2 \times V_c / (d_1^2 + d_2^2),$$

where, D shows the diameter of said single crystal, $V_c$ is the growth rate of said single crystal, $d_1$ and $d_2$ are the diameters of said two raw material bars respectively; the supply rate V of the raw material bars after compensating by said modification to said reference supply rate $V_0$, which is attained as follows, $$V = V_0 + \alpha (W_c - W_n),$$

where, $W_c$ and $W_n$ are the weight of said single crystal and the weight of said raw material bars charged respectively, that have increased a period from the beginning of charging said raw material at a time t, $\alpha$ is the regulating parameter of said supply rate V of said raw material bars based on said modification of unmatched supply of raw material bars; and where said two raw material bars are charged at said rate V.

3. The method of claim 1, wherein the reference coordinates of the raw material bars is $T_0$ when the raw material bars start to melt initially, the weight of said raw material is $W_0$ initially, the reference coordinates of said raw material bar is $T_t$ at a time t, and said raw material has weight of $W_t$, at a time t, and density of p and diameter of d, thus the fluctuation p of the tip of said raw material bar with respect to initial coordinates of said $T_0$ is determined as follows, $$p = T_t - T_0 - (W_0 - W_t)/(\pi d^2/4) \times \rho,$$

and by controlling the power of said heaters, said fluctuation p ultimately zero reaches.

* * * * *